(12) United States Patent  
Kim (10) Patent No.: US 11,699,642 B2  
(45) Date of Patent: Jul. 11, 2023

(54) SEMICONDUCTOR PACKAGE INCLUDING REDISTRIBUTED LAYER AND METHOD FOR FABRICATION THEREFOR

(71) Applicant: SAMSUNG ELECTRONICS CO., LTD., Suwon-si (KR)

(72) Inventor: Dongho Kim, Suwon-si (KR)

(73) Assignee: SAMSUNG ELECTRONIC CO., LTD., Suwon-si (KR)

( * ) Notice: Subject to any disclaimer, the term of this patent is extended or adjusted under 35 U.S.C. 154(b) by 0 days.

(21) Appl. No.: 16/739,931

(22) Filed: Jan. 10, 2020

(65) Prior Publication Data

US 2021/0013139 A1    Jan. 14, 2021

(30) Foreign Application Priority Data

Jul. 12, 2019 (KR) .................. 10-2019-0084554

(51) Int. Cl.
*H01L 23/31* (2006.01)
*H01L 23/498* (2006.01)
*H01L 23/00* (2006.01)

(52) U.S. Cl.
CPC .... *H01L 23/49816* (2013.01); *H01L 23/3114* (2013.01); *H01L 23/49861* (2013.01); *H01L 24/13* (2013.01)

(58) Field of Classification Search
CPC ............. H01L 23/49816; H01L 24/10; H01L 23/3114; H01L 23/3128; H01L 2224/02381; H01L 21/56–568; H01L 23/31–3192
See application file for complete search history.

(56) References Cited

U.S. PATENT DOCUMENTS

| | | | |
|---|---|---|---|
| 9,852,976 B2 | 12/2017 | Kelly et al. | |
| 10,014,260 B2 | 7/2018 | Tsai et al. | |
| 10,319,607 B2* | 6/2019 | Wu | ........................ H01L 21/486 |
| 2014/0327129 A1* | 11/2014 | Cho | .................... H01L 23/3675 |
| | | | 257/713 |
| 2017/0133310 A1 | 5/2017 | Kelly et al. | |

(Continued)

FOREIGN PATENT DOCUMENTS

KR    10-1605624 B1    3/2016

*Primary Examiner* — Phat X Cao
*Assistant Examiner* — William H Anderson
(74) *Attorney, Agent, or Firm* — Sughrue Mion, PLLC (57) ABSTRACT

A semiconductor package is provided. The semiconductor package includes a redistribution layer, a semiconductor chip, solder balls, an interposer, an encapsulant layer, and an underfill layer. The semiconductor chip is electrically connected to the redistribution layer, and disposed on an upper surface of the redistribution layer. The solder balls are disposed on the upper surface of the redistribution layer spaced apart from the semiconductor chip and are electrically connected to the redistribution layer. The interposer is electrically connected to the solder balls, and is disposed on an upper surface of the solder balls. The encapsulant layer encapsulates the semiconductor chip and side surfaces of the redistribution layer under the interposer. The underfill layer fills a space between a lower surface of the interposer and an upper surface of the encapsulant layer. The encapsulant layer includes a side surface encapsulant region surrounding the side surfaces of the redistribution layer.

19 Claims, 8 Drawing Sheets

(56) References Cited

U.S. PATENT DOCUMENTS

| | | | |
|---|---|---|---|
| 2018/0040572 A1* | 2/2018 | Haba | H01L 23/5383 |
| 2018/0083061 A1 | 3/2018 | Kim et al. | |
| 2018/0130749 A1 | 5/2018 | Tsai et al. | |
| 2018/0145061 A1* | 5/2018 | Jeong | H01L 23/5385 |
| 2019/0006339 A1* | 1/2019 | Lau | H01L 25/105 |
| 2019/0013273 A1 | 1/2019 | Jeng et al. | |
| 2019/0043829 A1 | 2/2019 | Kelly et al. | |
| 2019/0067145 A1* | 2/2019 | Chun | H01L 23/3128 |
| 2019/0088552 A1* | 3/2019 | Yu | H01L 25/50 |
| 2019/0096700 A1 | 3/2019 | Tsou et al. | |
| 2019/0103353 A1 | 4/2019 | Liu et al. | |
| 2019/0122901 A1* | 4/2019 | Lin | H01L 21/486 |
| 2020/0251395 A1* | 8/2020 | He | H01L 23/49816 |

* cited by examiner

SEMICONDUCTOR PACKAGE INCLUDING REDISTRIBUTED LAYER AND METHOD FOR FABRICATION THEREFOR

CROSS-REFERENCE TO RELATED APPLICATION(S)

This application claims priority to Korean Patent Application No. 10-2019-0084554 filed Jul. 12, 2019, the entire contents of which are incorporated by reference herein in their entirety.

BACKGROUND

1. Field

The present disclosure relates to a semiconductor package including a redistribution layer and method for fabrication therefor.

2. Description of Related Art

A wafer level process for fabricating a semiconductor device may include process for forming a redistribution layer. The redistribution layer may include a conductive metal distribution line. For example, the redistribution layer may include a metal distribution line having a predetermined arrangement. The redistribution layer may be formed on a silicon wafer by a method of patterning the plating. The redistribution layer may be damaged by external mechanical shock, moisture, and various foreign substances. Conventionally, the redistribution layer includes a core layer for enhancing mechanical strength. However, the thickness of the redistribution layer may be increased due to the core layer.

SUMMARY

It is an aspect to provide a semiconductor package including a redistribution layer including a plurality of dielectric layers except a core layer and a method for fabrication therefor.

According to an aspect of an embodiment, there is provided a semiconductor package. The semiconductor package comprises a redistribution layer; a semiconductor chip electrically connected to the redistribution layer, and disposed on an upper surface of the redistribution layer; a plurality of solder balls disposed on the upper surface of the redistribution layer spaced apart from the semiconductor chip and electrically connected to the redistribution layer; an interposer electrically connected to the plurality of solder balls, and disposed on upper surfaces of the plurality of solder balls; an encapsulant layer encapsulating the semiconductor chip and side surfaces of the redistribution layer under the interposer; and an underfill layer filling a space between a lower surface of the interposer and an upper surface of the encapsulant layer, wherein the encapsulant layer includes a side surface encapsulant region surrounding the side surfaces of the redistribution layer.

According to another aspect of an embodiment, there is provided a semiconductor package comprising a redistribution layer; a semiconductor chip electrically connected to the redistribution layer, and disposed on an upper surface of the redistribution layer; a plurality of inner solder balls electrically connected to the redistribution layer, and disposed on the upper surface of the redistribution layer; an interposer electrically connected to the plurality of inner solder balls, and disposed on upper surfaces of the plurality of inner solder balls; an encapsulant layer encapsulating the semiconductor chip, side surfaces of the redistribution layer and a bottom surface of the redistribution layer under the interposer; and an underfill layer filling a space between a lower surface of the interposer and an upper surface of the encapsulant layer, wherein the encapsulant layer includes a side surface encapsulant region surrounding the side surfaces of the redistribution layer, and a lower surface encapsulant region covering the bottom surface of the redistribution layer.

According to another aspect of an embodiment, there is provided a semiconductor package comprising a redistribution layer including a plurality of dielectric layers and a plurality of metal distribution lines; a semiconductor chip disposed on an upper surface of the redistribution layer; a connection structure between the redistribution layer and the semiconductor chip; a plurality of inner solder balls disposed on the upper surface of the redistribution layer, the plurality of internal inner solder balls being spaced apart from the semiconductor chip; an encapsulant layer encapsulating the semiconductor chip, the plurality of inner solder balls, and a side surface of the redistribution layer; an interposer disposed on the semiconductor chip, the plurality of internal inner solder balls, and the encapsulant layer; an underfill between the semiconductor chip and the interposer, the underfill surrounding upper portions of the plurality of inner solder balls; and a plurality of external solder balls disposed on a bottom surface of the redistribution layer.

According to another aspect of an embodiment, there is provided a method for fabricating a semiconductor package comprising attaching a semiconductor die to a dummy strip substrate, the semiconductor die including a silicon wafer layer, a redistribution layer formed on an upper side of the silicon wafer layer, and a plurality of inner solder balls; forming an encapsulant layer by encapsulating an upper surface of the dummy strip substrate, side surfaces of the silicon wafer layer, side surfaces of the redistribution layer and an upper surface of the redistribution layer, and side surfaces of the semiconductor die; disposing an interposer layer on upper surfaces of the plurality of inner solder balls; filling a space between an upper surface of the encapsulant layer and a lower surface of the interposer layer using an underfill resin; disposing a plurality of external solder balls on a lower surface of the redistribution layer exposed by grinding the dummy strip substrate and the silicon wafer layer; and sawing so as to surround the side surfaces of the redistribution layer by the encapsulant layer.

BRIEF DESCRIPTION OF THE DRAWINGS

The above and other aspects will be described with reference to the following drawings, in which.

DETAILED DESCRIPTION

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

According to various embodiments, a semiconductor package may include a redistribution layer (RDL), a semiconductor chip, a plurality of solder balls, an interposer, an encapsulant layer, and an underfill layer. The semiconductor chip is electrically connected to the redistribution layer, and disposed on an upper surface of the redistribution layer. The plurality of solder balls are electrically connected to the redistribution layer, and disposed on the upper surface of the redistribution layer spaced from the semiconductor chip. The interposer is electrically connected to the plurality of solder balls, and disposed on an upper surface of the plurality of solder balls. The redistribution layer does not include a core layer so that thickness can be reduced. The encapsulant layer encapsulates the semiconductor chip and side surfaces of the redistribution layer under the interposer. Mechanical strength of the redistribution layer is enhanced by the encapsulant layer surrounding the side surface of the redistribution layer. The underfill layer fills a space between a lower surface of the interposer and an upper surface of the encapsulant layer. The encapsulant layer includes a side surface encapsulant region surrounding the side surfaces of the redistribution layer.

According to the various embodiments, the semiconductor package and a method for fabrication therefor can reduce the overall thickness of the semiconductor package. Moreover, it is possible to increase the stability and reliability of the semiconductor package by protecting a portion of the redistribution layer of the semiconductor package exposed to the outside through the semiconductor package and the method for fabrication therefor. The semiconductor package and the method for fabrication therefore can increase the strength and durability of the semiconductor package.

Figure 1:
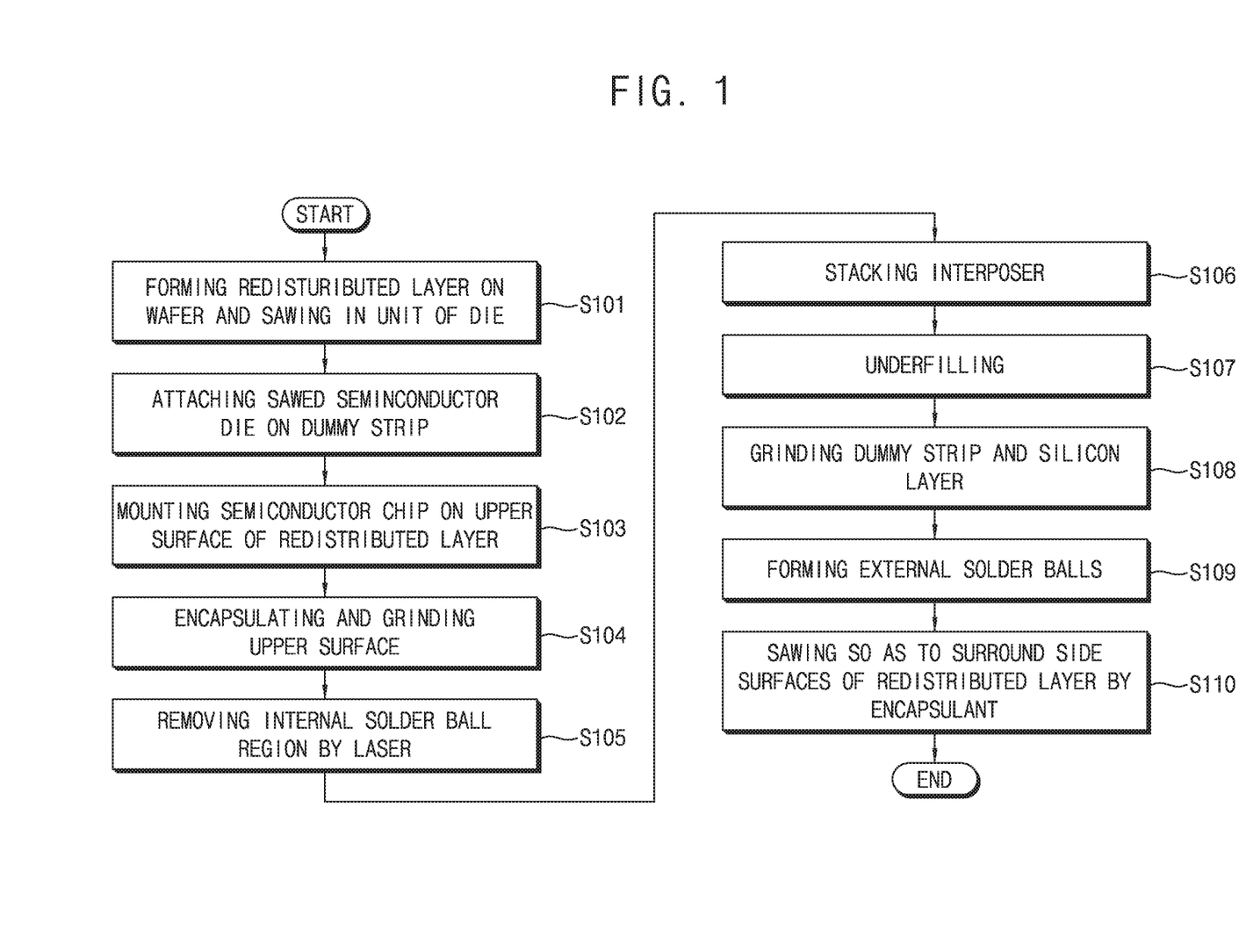
FIG. 1 is a flow diagram illustrating a method for fabricating a semiconductor package, according to an embodiment.

FIG. 1 is a flow diagram illustrating a method for fabricating a semiconductor package, according to an embodiment.

Referring to FIG. 1, a redistribution layer may be formed on a silicon wafer, and the silicon wafer on which the redistribution layer is formed may be sawed in an unit of a die (S101).

Figure 2:
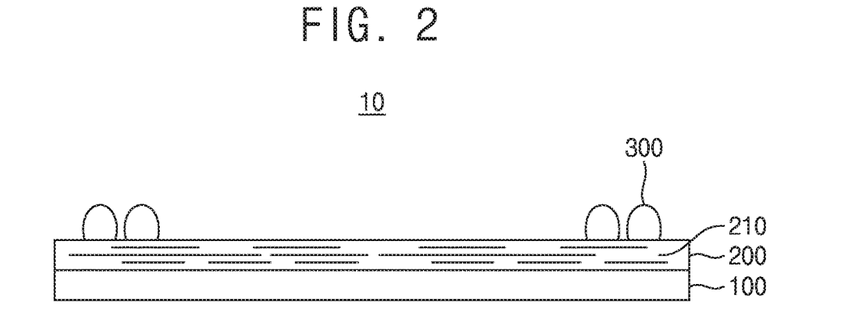
FIG. 2 is a cross-sectional view of a silicon wafer, a redistribution layer formed on the silicon wafer, and a solder ball formed on the redistribution layer, according to an embodiment.

For example, referring to FIG. 2, a redistribution layer 200 may be formed on a silicon wafer 100. It is noted that only a single semiconductor die 10 is illustrated in FIGS. 2-8 for purposes of conciseness of description.

The redistribution layer 200 may include a dielectric layer, except for a core layer to be thinner. That is, the redistribution layer 200 omits, and thus does not include, a core layer. A metal distribution line 210 may be formed in the dielectric layer of the redistribution layer 200. For example, the metal distribution line 210 may have a predetermined pattern. The metal distribution line 210 may be formed of a conductive material. The redistribution layer 200 may include the metal distribution line 210 formed in a patterning manner. A plurality of inner solder balls 300 for electrically connecting an interposer and the redistribution layer 200 may be disposed on the upper surface of the redistribution layer 200. The plurality of inner solder balls 300 may be referred to as a plurality of inner solder balls. The plurality of inner solder balls 300 may be electrically connected to the metal distribution line 210 of the redistribution layer 200. The silicon wafer 100 on which the redistribution layer 200 is formed may be sawed in a unit of a semiconductor die 10. The silicon wafer 100 that is sawed may be referred to as a silicon layer.

Referring again to FIG. 1, the semiconductor dies 10 which have been sawed may be attached to a dummy strip substrate (S102).

Figure 3:
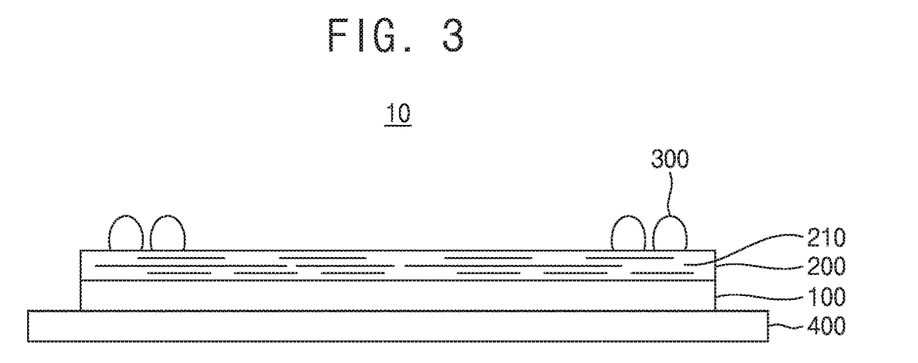
FIG. 3 is a cross-sectional view of a dummy strip, and a semiconductor die attached to the dummy strip, according to an embodiment.

For example, referring to FIG. 3, the semiconductor die 10 may be attached onto the dummy strip substrate 400. In other words, the plurality of semiconductor dies 10, after being sawed, may be attached onto the dummy strip substrate 400. The dummy strip substrate 400 may be referred to as a carrier strip substrate.

Figure 4:
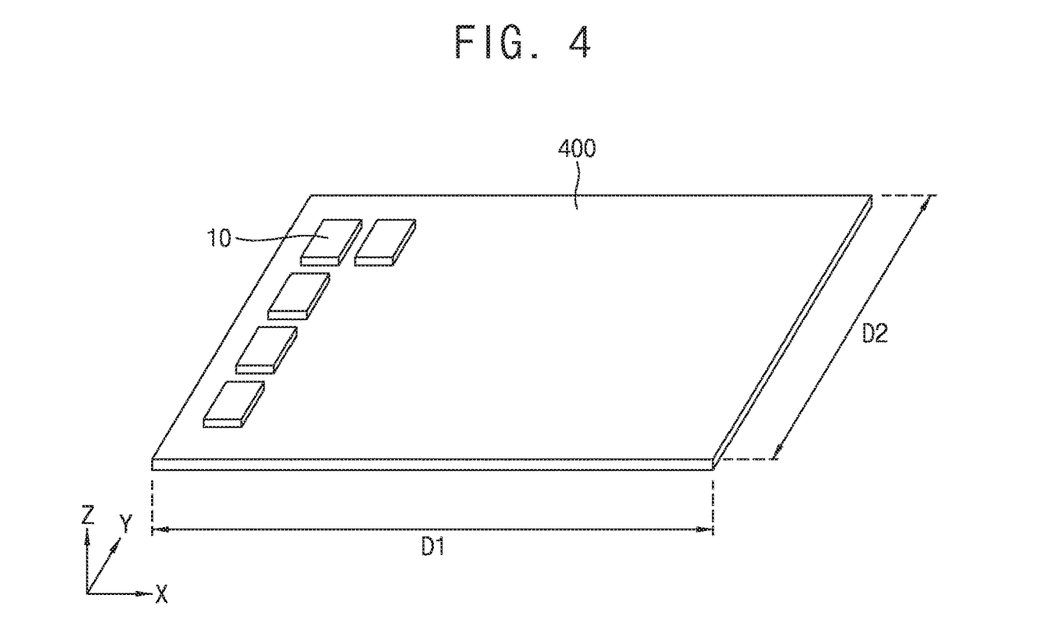
FIG. 4 is a conceptual diagram of a dummy strip, and a semiconductor die attached to the dummy strip, according to an embodiment.

For example, referring to FIG. 4, a width D1 of the dummy strip substrate 400 may be about 210 millimeters (mm), and a length D2 of the dummy strip 400 may be about 77.5 mm. The plurality of semiconductor dies 10 may be attached to the dummy strip substrate at predetermined intervals.

Referring again to FIG. 1, a semiconductor chip may be mounted on an upper surface of the redistribution layer (S103).

Figure 5:
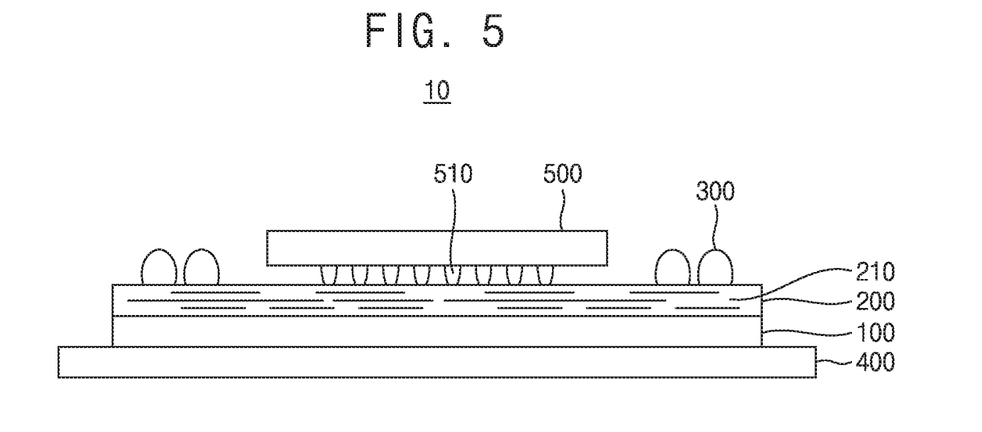
FIG. 5 is a cross-sectional view of a dummy strip, a semiconductor die attached on the dummy strip, and a semiconductor chip mounted on the die, according to an embodiment.

For example, referring to FIG. 5, the semiconductor chip 500 may be mounted on the upper surface of the redistribution layer 200. A connection structure 510 may be disposed on a lower surface of the semiconductor chip 500. The connection structure 510 may be disposed between the redistribution layer 200 and the semiconductor chip 500. For example, in some embodiments, the connection structure 510 may include a plurality of solder bumps. In some embodiments, the connection structure 510 may include a plurality of metal pads.

In some embodiments, the connection structure 510 may include a plurality of copper pillars and a plurality of solder bumps that are stacked. For example, a plurality of copper pillars may be disposed on the lower surface of the semiconductor chip 500. The plurality of solder bumps may be disposed on lower surfaces of the plurality of copper pillars, respectively. In other words, the plurality of copper pillars and the plurality of solder bumps may be provided in a one to one correspondence. The plurality of copper pillars and the plurality of solder bumps may be electrically connected. The plurality of solder bumps may be electrically connected to the redistribution layer.

In some embodiments, the connection structure 510 may include a plurality of metal pads. For example, the plurality of metal pads may be electrically connected to the redistribution layer.

In some embodiments, the semiconductor chip 500 may be a memory chip or a logic chip.

Referring again to FIG. 1, an upper surface may be encapsulated and grinded (S104). For example, the semiconductor dies 10 attached to the dummy strip substrate 400 may be encapsulated and then a grinding process may be performed.

Figure 6:
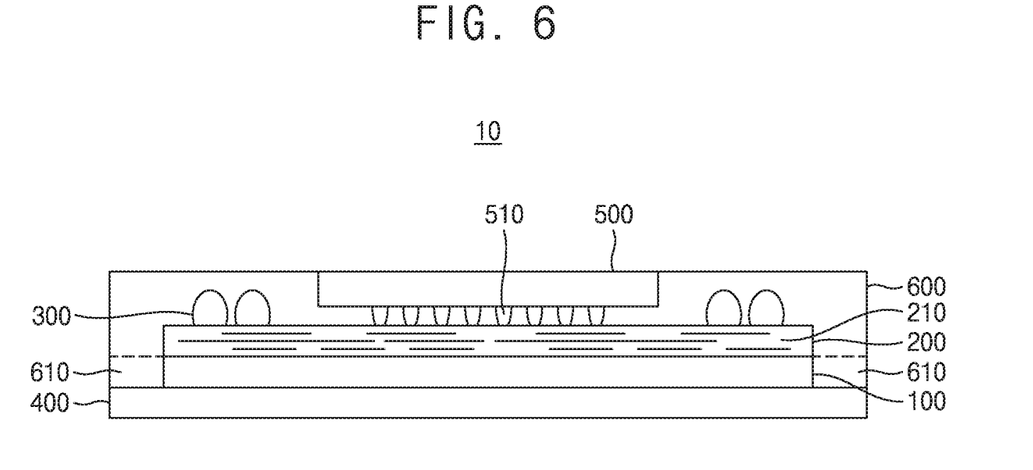
FIG. 6 is a cross-sectional view of a semiconductor die attached on a dummy strip, and a semiconductor package encapsulating a semiconductor chip mounted on the semiconductor die, according to an embodiment.

For example, referring to FIG. 6, exposed portions of each of the silicon layer 100 disposed on a dummy strip substrate 400, the redistribution layer 200 disposed on the silicon layer 100, the inner solder balls 300 and the semiconductor chip 500 disposed on the upper surface of the redistribution layer 200 may be encapsulated by an encapsulant 600. The encapsulant 600 may be but is not limited to one of epoxy resin or equivalents of epoxy resin. The encapsulant 600 may be referred to as an encapsulation layer or a molding layer or passivation layer.

The encapsulant layer 600 may surround and encapsulate side surfaces of the silicon layer 100, side surfaces and a top surface of the redistribution layer 200, and side surfaces and a bottom surface of the semiconductor chip 500. For convenience of description, the region surrounding the side surfaces of the redistribution layer 200 in the encapsulation layer 600 may be referred to as a side surface encapsulation region 610, as illustrated in FIG. 6.

Referring again to FIG. 1, an internal solder ball region may be removed by laser (S105). For example, a region corresponding to the position of the plurality of inner solder balls 300 disposed on the upper surface of the redistribution layer 200 that is encapsulated in the encapsulant 600 may be removed by laser drilling.

Figure 7:
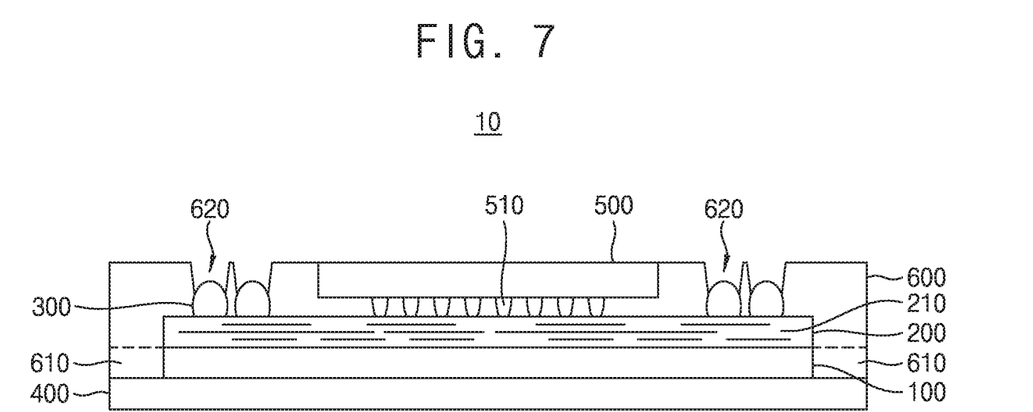
FIG. 7 is a cross-sectional view of a semiconductor package including an encapsulant layer from which an internal solder ball region has been removed, according to an embodiment.

For example, referring to FIG. 7, regions 620 corresponding to positions of the plurality of inner solder balls 300 disposed on the upper surface of the redistribution layer 200 in the encapsulant 600 may be removed by a laser. The plurality of inner solder balls 300 may be exposed to the outside through the regions 620 removed by the laser.

Referring again to FIG. 1, an interposer may be stacked (S106). For example, an interposer 700 may be stacked on the encapsulated semiconductor die 10.

Figure 8:
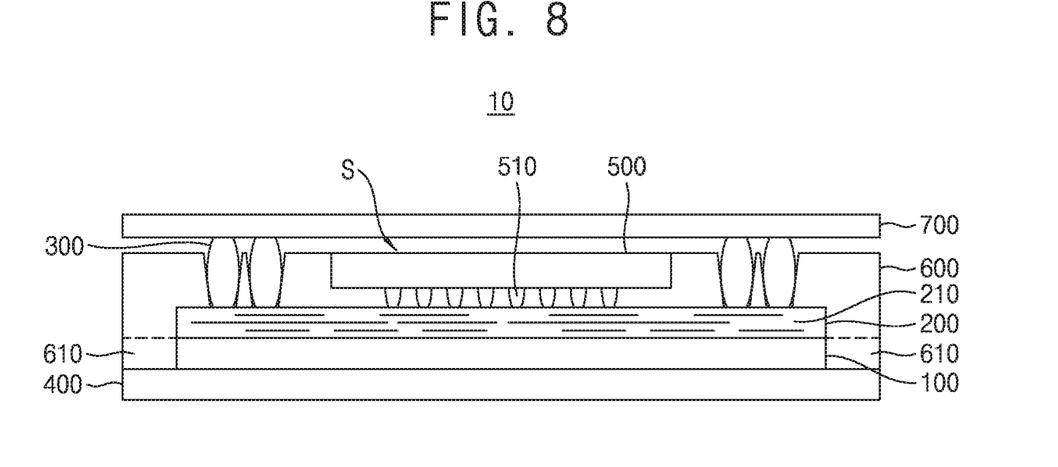
FIG. 8 is a cross-sectional view of a semiconductor package including an interposer, according to an embodiment.

For example, referring to FIG. 8, the interposer 700 may be stacked on the upper surface of the semiconductor die 10 that is encapsulated and the plurality of inner solder balls 300 may be electrically connected to solder balls disposed on a lower surface of the interposer 700. For convenience of description, the solder balls disposed on the lower surface of the interposer 700 may be referred to as a plurality of internal solder balls. For example, in some embodiments, the solder balls disposed on the lower surface of the interposer 700 may be included in the plurality of inner solder balls 300.

The interposer 700 may be disposed higher than the upper surface of the semiconductor chip 500. In other words, there may be an empty space S between the lower surface of the interposer 700 and the upper surface of the semiconductor chip 500. For example, a height of a vertical cross-section of the plurality of inner solder balls 300 may exceed a height of a vertical cross-section of the semiconductor chip 500 including the connection structure 510. The interposer 700 may be electrically connected to the redistribution layer 200 through the plurality of inner solder balls 300.

Referring again to FIG. 1, underfilling may be performed (S107). For example, the empty space S between the upper surface of the semiconductor die 10 that is encapsulated and the lower surface of the interposer 700 may be underfilled.

Figure 9:
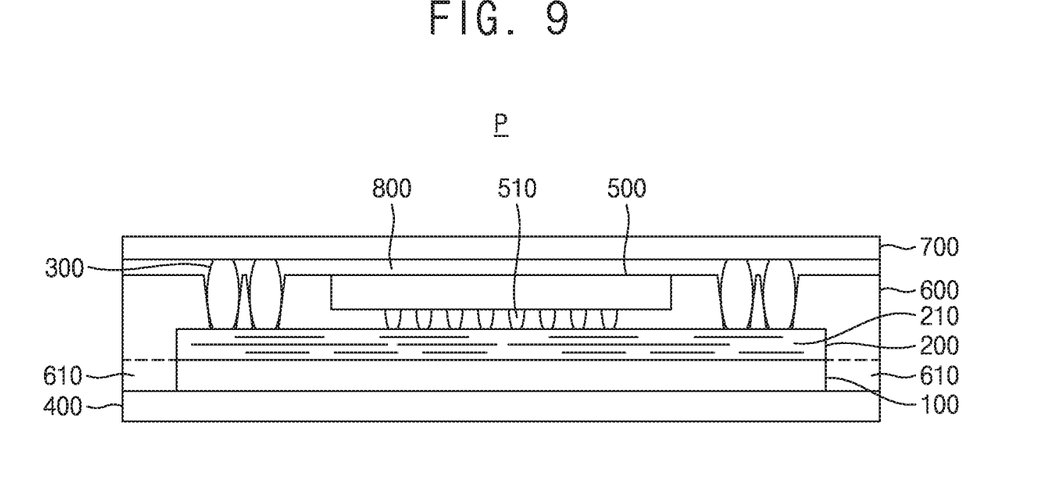
FIG. 9 is a cross-sectional view of a semiconductor package including an underfill layer, according to an embodiment.

For example, referring to FIG. 9, the empty space S (see FIG. 8) between the upper surface of the semiconductor die 10 that is encapsulated and the lower surface of the interposer 700 may be filled with underfill resin 800. The region filled by the underfill resin 800 may be referred to as an underfill layer. The semiconductor die 10 that is encapsulated and includes the underfill layer 800 as formed with reference to FIGS. 1-9 may be referred to as a semiconductor package P. As with FIGS. 2-8, it is noted that in FIGS. 9-11 only a single semiconductor package P is illustrated for conciseness of description.

Referring again to FIG. 1, the dummy strip and the silicon wafer may be grinded (S108).

Figure 10:
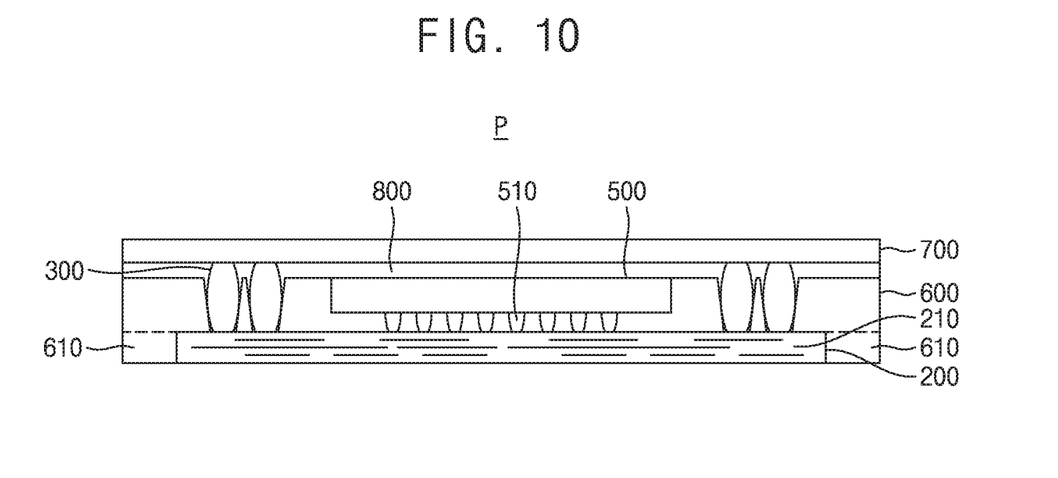
FIG. 10 is a cross-sectional view of a semiconductor wafer from which a silicon wafer and dummy strip have been removed, according to an embodiment.

For example, referring to FIG. 10, the dummy strip 400 and the silicon layer 100 constituting the lower portion of the semiconductor package P may be grinded. The lower surface of the redistribution layer 200 may be exposed due to the grinding of the dummy strip 400 and the silicon layer 100.

Referring again to FIG. 1, a plurality of external solder balls may be formed (S109). For example, the plurality of external solder balls 900 may be formed on a lower surface of the redistribution layer 200 that has been exposed by grinding. The semiconductor package may be sawed so that the encapsulant surrounds the side surfaces of the redistribution layer (S110).

Figure 11:
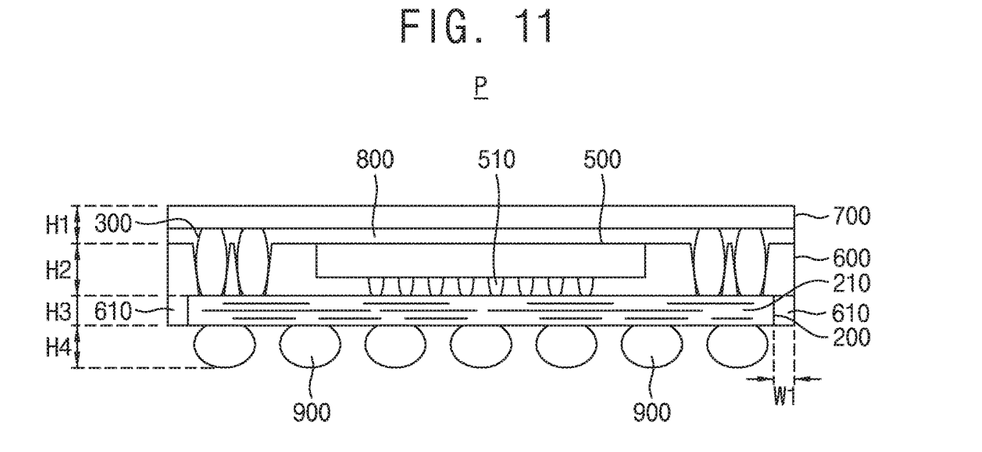
FIG. 11 is a cross-sectional view of a semiconductor package including a plurality of external solder balls, according to an embodiment.

For example, referring to FIG. 11, the plurality of external solder balls 900 may be formed on the lower surface of the redistribution layer 200. The plurality of external solder balls 900 may be electrically connected to the metal distribution line 210 of the redistribution layer 200. The plurality of external solder balls 900 may be electrically connected to the semiconductor chip 500 through the redistribution layer 200. The plurality of external solder balls 900 may be electrically connected to the interposer 700 through the redistribution layer 200 and the plurality of inner solder balls 300.

The semiconductor package P may be sawed so that the side surfaces of the redistribution layer 200 are surrounded by the encapsulation layer 600. For example, a width W1 of one side of a vertical cross-section of the encapsulation region 610, which surrounds side surfaces of the redistribution layer 200, may be equal or less than about 140 micrometers (μm). In some embodiments, a width of the other side of the vertical cross-section of the encapsulation region 610 may be the same as the width W1.

In some embodiments, a vertical distance H1 from the upper surface of the semiconductor chip 500 to the upper surface of the interposer 700 may be about 140 μm. In some embodiments, a vertical distance H2 from the upper surface of the semiconductor chip 500 to the upper surface of the redistribution layer 200 may be about 120 μm. In some embodiments, a vertical distance H3 from the upper surface to the lower surface of the redistribution layer 200 may be about 60 μm. In some embodiments, a vertical distance H4 from the lower surface of the redistribution layer 200 to a lower surface of the external solder bump 900 may be about 100 μm.

Figure 12:
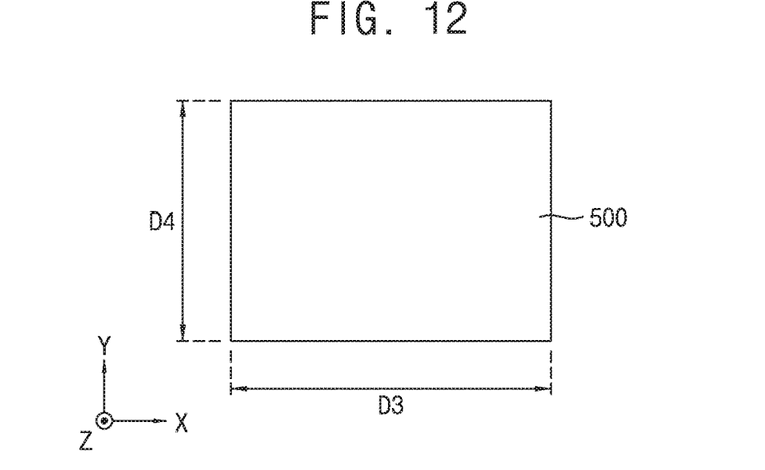
FIG. 12 is a top view of a semiconductor chip, according to an embodiment.

Referring to FIG. 12, in some embodiments, a width D3 of the upper surface or the lower surface of the semiconductor chip 500 disposed on the upper surface of the redistribution layer 200 may be about 7 mm to about 11 mm. In some embodiments, a length D4 of the upper surface or the lower surface of the semiconductor chip 500 may be about 7 mm to about 11 mm, where the length D4 is orthogonal to the length D3.

Figure 13:
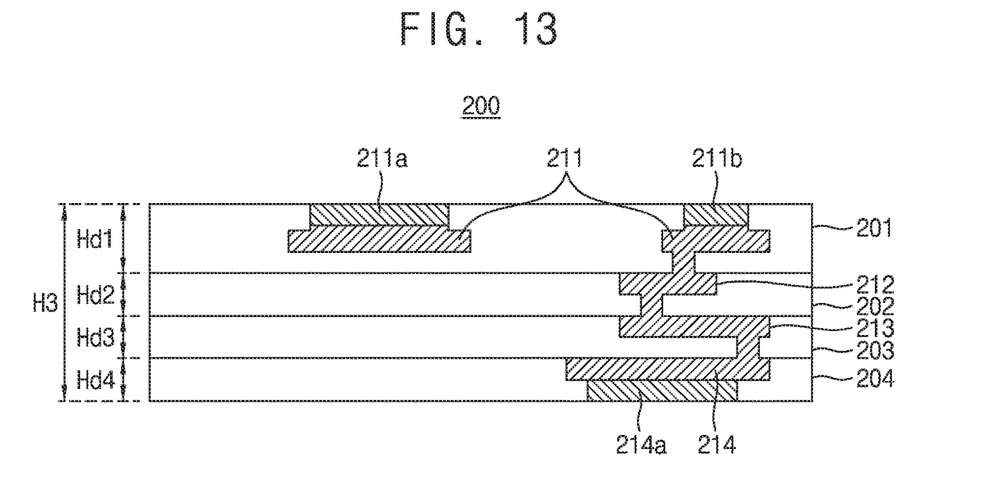
FIG. 13 is a cross-sectional view of a redistribution layer, according to an embodiment.

Referring to FIG. 13, the redistribution layer 200 may include a first wiring layer 201, a second wiring layer 202, a third wiring layer 203, and a fourth wiring layer 204.

The first wiring layer 201 may include a first conductive line 211, a plurality of internal solder ball pads 211a, and a plurality of semiconductor chip pads 211b. It is noted that only one of each of the internal solder ball pads 211a and the semiconductor chip pads 211b are shown in FIG. 13 for conciseness of description. The first conductive line 211 may be electrically connected to the plurality of internal solder ball pads 211a and the plurality of semiconductor chip pads 211b.

The first conductive line 211 may be disposed in the first wiring layer 201 according to a predetermined pattern.

The plurality of internal solder ball pads 211a may be conductive pads for electrically connecting the plurality of inner solder balls 300 to the first conductive line 211. For example, the plurality of inner solder ball pads 211a may be electrically connected to the plurality of inner solder balls 300.

The plurality of semiconductor chip pads 211b may be a conductive pad for electrically connecting the semiconductor chip 500 to the first wiring layer 201. For example, the connection structure 510 of the semiconductor chip 500 may be electrically connected to the plurality of semiconductor chip pads 211b. For example, if the connection structure 510 of the semiconductor chip 500 includes a plurality of solder bumps, the plurality of solder bumps may be electrically connected to the plurality of semiconductor chip pads 211b. For example, if the connection structure 510 of the semiconductor chip 500 includes a plurality of metal pads, the plurality of metal pads may be electrically connected to the plurality of semiconductor chip pads 211b.

In some embodiments, a height Hd1 of a vertical cross-section of the first wiring layer 201 may be about 15 μm.

The second wiring layer 202 may include a second conductive line 212. For example, the second conductive line 212 may be disposed in the second wiring layer 202 according to a predetermined pattern. The second conductive line 212 may be electrically connected to the first conductive line 211.

In some embodiments, a height Hd2 of a vertical cross-section of the second wiring layer 202 may be about 15 μm.

The third wiring layer 203 may include a third conductive line 213. For example, the third conductive line 213 may be disposed in the third wiring layer 203 according to a predetermined pattern. The third conductive line 213 may be electrically connected to the second conductive line 212.

In some embodiments, a height Hd3 of a vertical cross-section of the third wiring layer 203 may be about 15 μm.

The fourth wiring layer 204 may include a fourth conductive line 214 and an external solder ball pad 214a. The fourth conductive line 214 and the external solder ball pad 214a may be electrically connected. The fourth conductive line 214 may be disposed in the fourth wiring layer 204 according to a predetermined pattern. The fourth conductive line 214 may be electrically connected to the third conductive line 213.

The plurality of external solder ball pads 214a may be conductive pads for electrically connecting the plurality of external solder balls 900 to the fourth conductive lines 214. For example, a plurality of external solder ball pads 214a may be electrically connected to the plurality of external solder balls 900.

In some embodiments, a height Hd4 of a vertical cross-section of the fourth wiring layer 204 may be about 15 μm.

Figure 14:
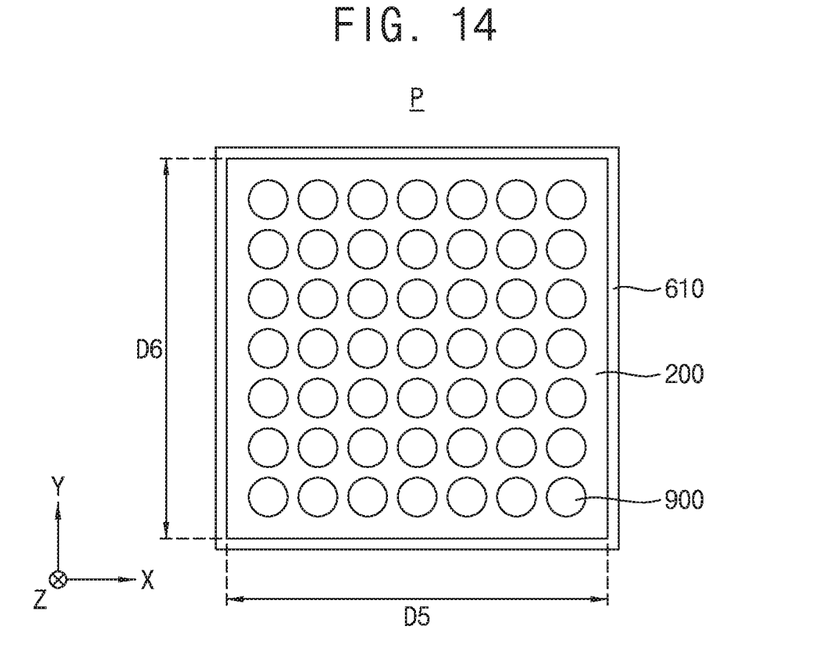
FIG. 14 is a bottom view of a semiconductor package, according to an embodiment.

Referring to FIG. 14, the semiconductor package P according to an embodiment may protect the side surfaces of the redistribution layer 200 through the encapsulation region 610 which is surrounding the side surfaces of the redistribution layer 200. That is, the semiconductor package P according to various embodiments may protect the redistribution layer 200 from exposure to and damage from the outside due to the encapsulation region 610 that surrounds the side surfaces of the redistribution layer 200. For example, in the related art, a part of the conductive line 210 may be exposed on a part of the side surfaces of the redistribution layer 200, and thus the stability and reliability of the redistribution layer 200 can be lowered due to the exposed part of the conductive line 210. By comparison, according to various embodiments, the side encapsulation region 610 surrounds the side surfaces of the redistribution layer 200, thereby protecting the exposed part of the conductive line 210. The stability and reliability of the redistribution layer 200 thus can be improved by the side encapsulation region 610.

In some embodiments, a width D5 of the lower surface of the redistribution layer 200 may be about 10 mm to about 14 mm. In some embodiments, a length D6 of the lower surface of the redistribution layer 200 may be about 10 mm to about 14 mm, where the length D6 is orthogonal to the width D5.

Figure 15:
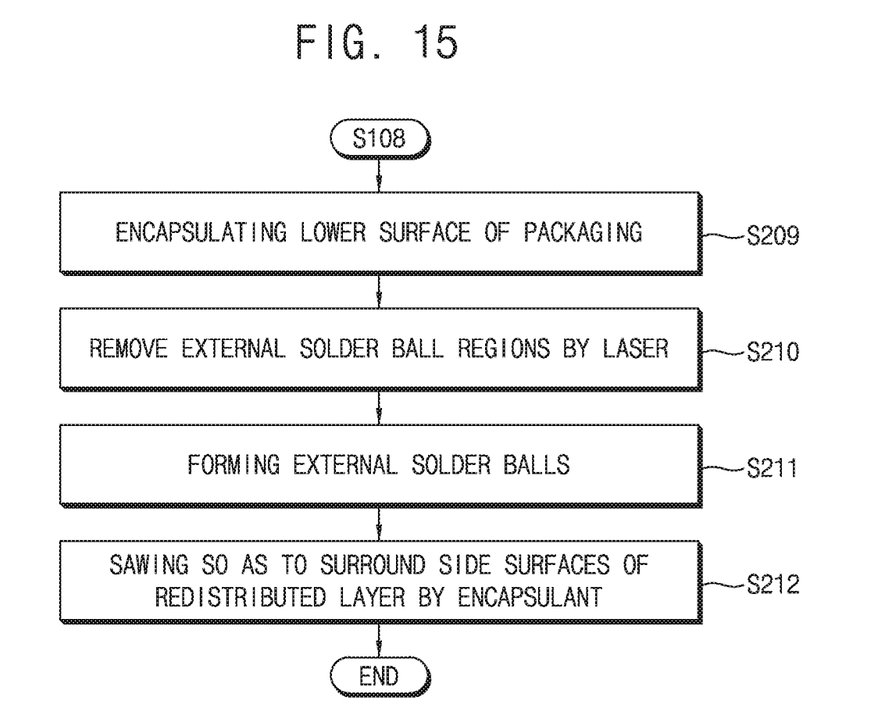
FIG. 15 is a flow diagram illustrating a method for fabricating a semiconductor package, according to an embodiment.

FIG. 15 is a flow diagram illustrating a method for fabricating a semiconductor package according to an embodiment.

Referring to FIG. 15, a packaging procedure according to an embodiment may proceed from S108 in FIG. 1. In other words, after S108 in FIG. 1, S209 to S212 illustrated in FIG. 15 may be performed.

Figure 16:
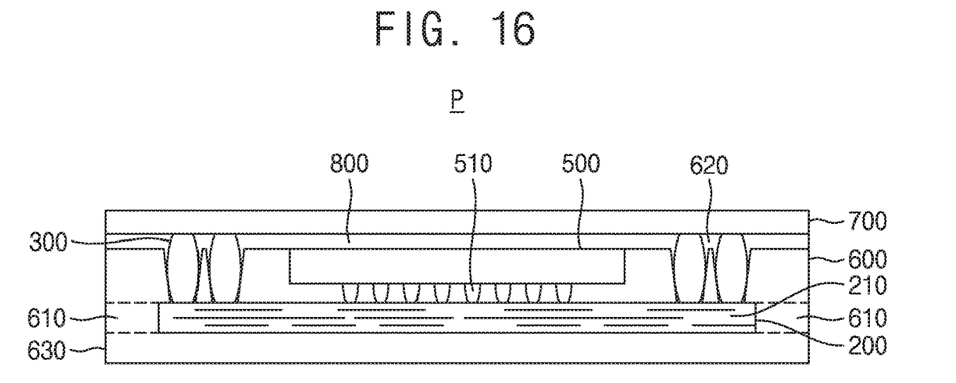
FIG. 16 is a cross-sectional view of a semiconductor package including a bottom encapsulant layer, according to an embodiment.

For example, referring to FIG. 16, after the dummy strip and silicon layer are grinded (S108), the lower surface of the semiconductor package may be encapsulated (S209). The encapsulant, which is encapsulating the lower surface of the semiconductor package P, may be referred to as a lower surface encapsulant region 630. For example, in some embodiments, the encapsulant layer 600 may include a side surface encapsulant region 610 and the lower surface encapsulant region 630.

Referring again to FIG. 15, an external solder ball region may be removed by laser (S210). For example, a region in the lower surface encapsulation region 630 of the semiconductor package P where a plurality of external solder balls are to be disposed, may be removed by laser.

Figure 17:
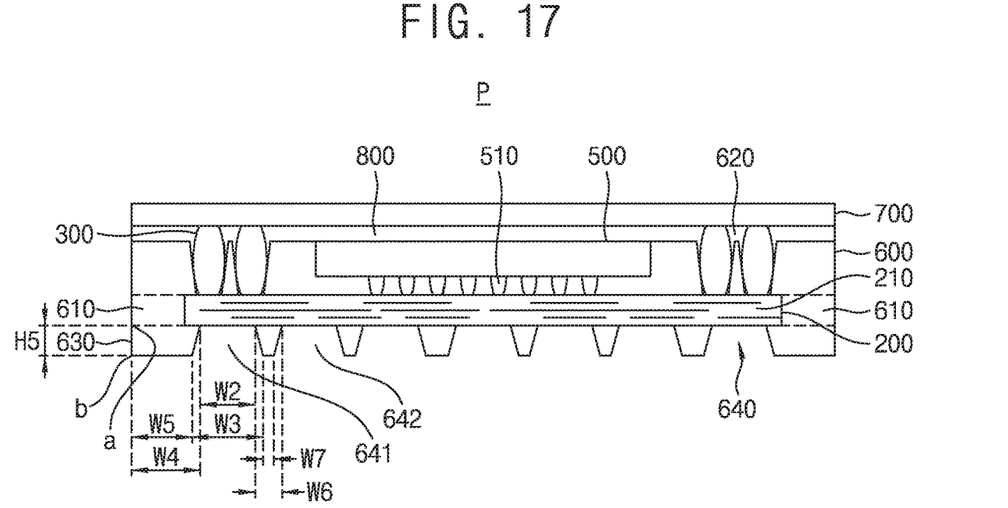
FIG. 17 is a cross-sectional view of a semiconductor package including a lower surface encapsulant layer including an outer solder ball region, according to an embodiment.

For example, referring to FIG. 17, external solder ball regions 640 of the lower surface encapsulant region 630 where the plurality of external solder balls are to be disposed may be removed by a laser drilling manner. A portion of the lower surface of the redistribution layer 200 where the plurality of external solder balls are to be disposed may thus be exposed through the external solder ball region 640.

The external solder ball region 640 may include a plurality of circular holes. For example, the plurality of circular holes may include a first circular hole 641 closest to a sidewall of the semiconductor package P and a second circular hole 642 adjacent to the first circular hole 641, as shown in FIG. 17. Each of the plurality of circular holes may become narrower from the lower surface of the lower surface encapsulation region 630 toward the redistribution layer 200.

In some embodiments, a width W2 of a diameter of an upper circle adjacent to the redistribution layer 200 in the first circular hole 641 may be less than a width W3 of a diameter of a lower circle adjacent to the lower surface of the lower surface encapsulation area 630, as shown in FIG. 17.

For example, in some embodiments, the width W2 of the diameter of the upper circle of the first circular hole 641 may be about 300 μm. In some embodiments, the width W3 of the diameter of the lower circle of the first circular hole 641 may be about 360 μm.

In some embodiments, in a vertical cross-section of the semiconductor package P, a length W4 of a shortest distance from a point a that is parallel to the lower surface of the redistribution layer 200 in the side surface of the lower surface encapsulant region 630 to point of the circumference of the upper circle of the first circular hole 641 may be about 220 μm.

In some embodiments, in the vertical cross-section of the semiconductor package P, a length W5 of a shortest distance from an edge point b of the side surface of the lower surface encapsulant region 630 to a point of the circumference of the lower circle of the first circular hole 641 may be about 190 μm.

In some embodiments, in the vertical cross-section of the semiconductor package P, a length W6 of a shortest distance between a point of the circumference of the upper circle of the first circular hole 641 and a point of the circumference of the upper circle of the second circular hole 642 may be about 150 μm.

In some embodiments, in the vertical cross-section of the semiconductor package P, a length W7 of a shortest distance between a point of the circumference of the lower circle of the first circular hole 641 and a point of the circumference of the lower circle of the second circular hole 642 may be about 90 μm.

A height H5 of the vertical cross-section of the lower surface encapsulation region 630 may be about 50 μm.

Referring again to FIG. 15, a plurality of external solder balls may be formed (S211). For example, the plurality of external solder balls may be formed in the external solder ball regions 640 of the semiconductor package P, respectively. Operation S212 is the same as operation S110 of FIG. 1 and therefore a repeated description thereof is omitted for conciseness.

Figure 18:
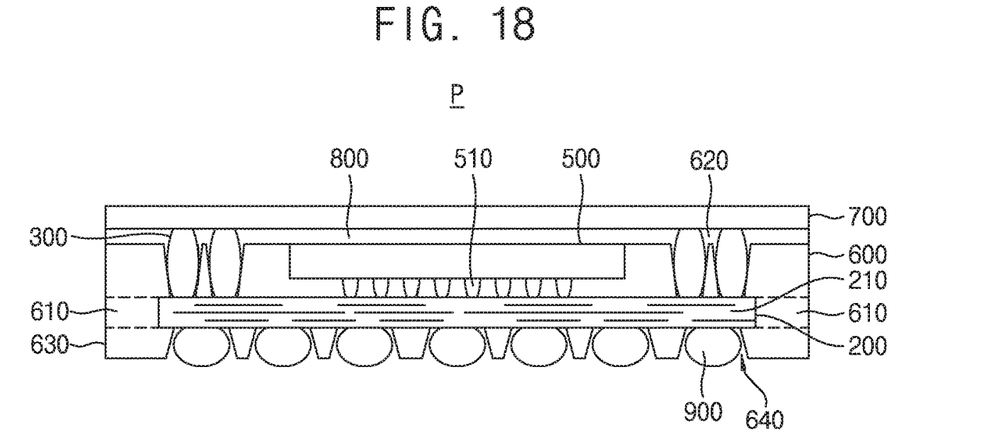
FIG. 18 is a cross-sectional view of a semiconductor package including a lower surface encapsulant layer and a plurality of external solder balls, according to an embodiment.

For example, referring to FIG. 18, the plurality of external solder balls 900 may be formed in the external solder ball regions 640 of the semiconductor package P, respectively.

Figure 19:
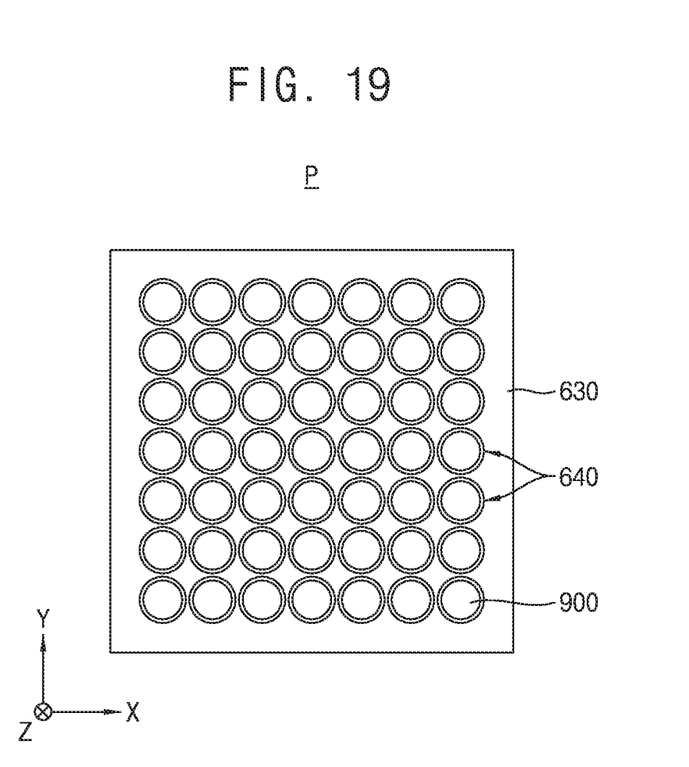
FIG. 19 is a bottom view of a semiconductor package, according to an embodiment.

FIG. 19 is a bottom view of a semiconductor package 10 according to an embodiment. Referring to FIG. 19, the lower surface encapsulant region 630 may encapsulate the bottom surface of the semiconductor package 10 except for the external solder ball regions 640.

The lower surface encapsulation region 630 can protect the lower surface of the redistribution layer 200 exposed on the lower surface of the semiconductor package 10 from damage from the outside. The lower surface encapsulation region 630 protects the lower surface of the redistribution layer 200, thereby improving the stability and reliability of the redistribution layer 200.

The lower surface encapsulation region 630 may have a lattice shape and may cover the lower surface of the redistribution layer 200 exposed on the lower surface of the semiconductor package P with the lattice shape. The lower surface encapsulation region 630 may fix the lower surface of the semiconductor package P with the lattice shape. The lower encapsulation region 630 fixes the lower surface of the redistribution layer 200, thereby increasing the strength of the lower surface of the semiconductor package P including the lower surface of the redistribution layer 200.

As will be appreciated by those skilled in the art, the various embodiments described in this disclosure may be modified and varied over a wide range of applications. Accordingly, the scope of the claimed subject matter should not be limited to any of the specific exemplary teachings discussed above, but is defined by the following claims.

What is claimed is:

1. A semiconductor package comprising:
   a redistribution layer;
   a semiconductor chip electrically connected to the redistribution layer, and disposed on an upper surface of the redistribution layer;
   a plurality of solder balls disposed on the upper surface of the redistribution layer spaced apart from the semiconductor chip and electrically connected to the redistribution layer;
   an interposer electrically connected to the plurality of solder balls, and disposed directly on upper surfaces of the plurality of solder balls;
   an encapsulant layer encapsulating the semiconductor chip, and side surfaces and a portion of the upper surface of the redistribution layer under the interposer; and
   an underfill layer filling a space between a lower surface of the interposer and an upper surface of the encapsulant layer,
   wherein the encapsulant layer includes a side surface encapsulant region surrounding the side surfaces of the redistribution layer, and a first region surrounding the semiconductor chip and covering the upper surface of the redistribution layer,
   wherein the side surface encapsulant region and the first region are continuously integrated with each other without a boundary therebetween and integrally formed through a single process,
   wherein the underfill layer contacts the lower surface of the interposer, the upper surface of the encapsulant layer, an upper surface of the semiconductor chip, and side surfaces of the plurality of solder balls, and
   wherein upper portions of the plurality of solder balls are surrounded by the underfill layer and lower portions of the plurality of solder balls are surrounded by the encapsulant layer and contact the encapsulant layer.

2. The semiconductor package of claim 1, wherein the redistribution layer includes a plurality of dielectric layers except for a core layer.

3. The semiconductor package of claim 2, wherein the plurality of dielectric layers includes a first redistribution layer, a second redistribution layer, a third redistribution layer, and a fourth redistribution layer, and
a height of a vertical cross-section of each of the first redistribution layer, the second redistribution layer, the third redistribution layer, and the fourth redistribution layer is 15 μm.

4. The semiconductor package of claim 1, further comprising a connection structure disposed on a lower surface of the semiconductor chip,
wherein the semiconductor chip is electrically connected to the redistribution layer through the connection structure.

5. The semiconductor package of claim 4, wherein the connection structure includes a solder bump or a metal pad electrically connected to the redistribution layer.

6. The semiconductor package of claim 1, wherein a width of the upper surface of the redistribution layer is 10 mm to 14 mm, and a length of the upper surface of the redistribution layer is 10 mm to 14 mm.

7. The semiconductor package of claim 1, wherein, in a vertical cross-section of the semiconductor package, a height from an upper surface of the interposer to the upper surface of the semiconductor chip is 140 μm.

8. The semiconductor package of claim 1, wherein, in a vertical cross-section of the semiconductor package, a width of the upper surface of the semiconductor chip is 7 mm to 11 mm, and a length of the upper surface of the semiconductor chip is 7 mm to 11 mm.

9. The semiconductor package of claim 1, wherein, in a vertical cross-section of the semiconductor package, a width of one side of the side surface encapsulant region is 140 μm.

10. The semiconductor package of claim 1, wherein, in a vertical cross-section of the semiconductor package, a height of the redistribution layer is 60 μm.

11. A semiconductor package comprising:
a redistribution layer;
a semiconductor chip electrically connected to the redistribution layer, and disposed on an upper surface of the redistribution layer;
a plurality of inner solder balls electrically connected to the redistribution layer, and disposed on the upper surface of the redistribution layer;
an interposer electrically connected to the plurality of inner solder balls, and disposed on an upper surface of the plurality of inner solder balls;
an encapsulant layer encapsulating the semiconductor chip, side surfaces of the redistribution layer and a bottom surface and a portion of the upper surface of the redistribution layer under the interposer; and
an underfill layer filling a space between a lower surface of the interposer and an upper surface of the encapsulant layer,
wherein the encapsulant layer includes a side surface encapsulant region surrounding the side surfaces of the redistribution layer, a first region surrounding the semiconductor chip and covering the upper surface of the redistribution layer, and a lower surface encapsulant region covering the bottom surface of the redistribution layer,
wherein the side surface encapsulant region and the first region are continuously integrated with each other without a boundary therebetween and integrally formed through a single process,
wherein the underfill layer contacts the lower surface of the interposer, the upper surface of the encapsulant layer, an upper surface of the semiconductor chip, and side surfaces of the plurality of inner solder balls, and
wherein upper portions of the plurality of inner solder balls are surrounded by the underfill layer and lower portions of the plurality of inner solder balls are surrounded by the encapsulant layer and contact the encapsulant layer.

12. The semiconductor package of claim 11, wherein, in a vertical cross-section of the semiconductor package, a height of the lower surface encapsulant region is 50 μm.

13. The semiconductor package of claim 11, wherein the lower surface encapsulant region includes an external solder ball region for disposing a plurality of external solder balls.

14. The semiconductor package of claim 13, wherein the external solder ball region includes a plurality of circular holes.

15. The semiconductor package of claim 14, wherein each of the plurality of circular holes includes an upper circle formed on an upper surface of the lower surface encapsulant region, and a lower circle formed on a lower surface of the lower surface encapsulant region.

16. The semiconductor package of claim 15, wherein a diameter of the lower circle is larger than a diameter of the upper circle.

17. The semiconductor package of claim 16, wherein the diameter of the upper circle is 300 μm.

18. The semiconductor package of claim 16, wherein the diameter of the lower circle is 360 μm.

19. A semiconductor package comprising:
a redistribution layer including a plurality of dielectric layers and a plurality of metal distribution lines;
a semiconductor chip disposed on an upper surface of the redistribution layer;
a connection structure between the redistribution layer and the semiconductor chip;
a plurality of inner solder balls disposed on the upper surface of the redistribution layer, the plurality of inner solder balls being spaced apart from the semiconductor chip;
an encapsulant layer encapsulating the semiconductor chip, the plurality of inner solder balls, and a side surface and a portion of the upper surface of the redistribution layer;
an interposer disposed on the semiconductor chip, the plurality of inner solder balls, and the encapsulant layer;
an underfill between the semiconductor chip and the interposer; and
a plurality of external solder balls disposed on a bottom surface of the redistribution layer,
wherein the underfill contacts a lower surface of the interposer, an upper surface of the encapsulant layer, an upper surface of the semiconductor chip, and side surfaces of the plurality of inner solder balls,
wherein the encapsulant layer includes a side surface encapsulant region surrounding the side surfaces of the redistribution layer, and a first region surrounding the semiconductor chip and covering the upper surface of the redistribution layer,
wherein the side surface encapsulant region and the first region are continuously integrated with each other without a boundary therebetween and integrally formed through a single process, and wherein upper portions of the plurality of inner solder balls are surrounded by the underfill and lower portions of the plurality of inner solder balls are surrounded by the encapsulant layer and contact the encapsulant layer.

\* \* \* \* \*